United States Patent
Yang et al.

(10) Patent No.: US 9,209,765 B2
(45) Date of Patent: Dec. 8, 2015

(54) QUICK COMPARISON CIRCUIT

(71) Applicant: IPGoal Microelectronics (Sichuan) Co., Ltd., Chengdu (CN)

(72) Inventors: Baoding Yang, Chengdu (CN); Zhengxian Zou, Chengdu (CN)

(73) Assignee: IPGoal Microelectronics (Sichuan) Co., Ltd., Chengdu (CN)

( * ) Notice: Subject to any disclaimer, the term of this patent is extended or adjusted under 35 U.S.C. 154(b) by 0 days.

(21) Appl. No.: 14/446,960

(22) Filed: Jul. 30, 2014

(65) Prior Publication Data

US 2015/0200633 A1    Jul. 16, 2015

(30) Foreign Application Priority Data

Jan. 16, 2014    (CN) .......................... 2014 1 0020407

(51) Int. Cl.
  *H03K 5/22*    (2006.01)
  *H03F 3/45*    (2006.01)
  *H03F 1/02*    (2006.01)

(52) U.S. Cl.
  CPC .......... *H03F 3/45179* (2013.01); *H03F 1/0261* (2013.01); *H03F 2200/405* (2013.01); *H03F 2203/45394* (2013.01); *H03F 2203/45644* (2013.01); *H03F 2203/45728* (2013.01)

(58) Field of Classification Search
  None
  See application file for complete search history.

(56) References Cited

U.S. PATENT DOCUMENTS

| | | | |
|---|---|---|---|
| 5,600,280 A * | 2/1997 | Zhang | 331/57 |
| 6,535,031 B1 * | 3/2003 | Nguyen et al. | 327/65 |
| 2010/0127908 A1 * | 5/2010 | Carreau et al. | 341/155 |
| 2011/0115529 A1 * | 5/2011 | Jansson | 327/90 |

* cited by examiner

*Primary Examiner* — Long Nguyen
(74) *Attorney, Agent, or Firm* — Shimokaji IP

(57) ABSTRACT

A quick comparison circuit includes a cascaded N-stage operational amplifier, a flip-latch, a biasing circuit, and a control signal generating circuit, with N≥2, and two differential signals to be compared being inputted to an input terminal of a first stage operational amplifier, an output terminal of a Nth stage operational amplifier being connected with an input terminal of the flip-latch, the biasing circuit supplying a biasing current to each stage operational amplifier, the control signal generating circuit being connected with the N-stage operational amplifier and the flip-latch respectively to supply a working time sequence and a reset control signal for them, and each stage operational amplifier having the same structure. This circuit has high gain and improved comparison speed.

5 Claims, 1 Drawing Sheet

US 9,209,765 B2

QUICK COMPARISON CIRCUIT

RELATED APPLICATIONS

This application claims the benefit of priority to Chinese Patent Application No. 201410020407.0, filed on Jan. 16, 2014, which is hereby incorporated by reference in its entirety.

FIELD OF THE INVENTION

The present invention relates to technical field of integrated circuits and, more particularly to a quick comparison circuit.

BACKGROUND OF THE INVENTION

Comparison circuits are widely used in conversion process between the analog signals and the digital signals (A/D conversion) which the sampled analog signal will be flowed through an operational amplifier or a comparator to determine its digital value. This operational amplifier utilizes an open-loop mode commonly that no compensation for the operational amplifier is needed, so that the operational amplifier may obtain a wider bandwidth and a higher frequency response. However, it's known that mutual restraint appears in the gain and the comparison speed of the amplifier always, which causes a difficulty to achieve both quick comparison and high accuracy at a certain process condition.

Therefore, there is a need for an improved quick comparison circuit to overcome the above-mentioned drawbacks.

SUMMARY OF THE INVENTION

One objective of the present invention is to provide a quick comparison circuit having high gain and improved comparison speed.

To achieve the above-mentioned objective, a quick comparison circuit of the present invention includes a cascaded N-stage operational amplifier, a flip-latch, a biasing circuit, and a control signal generating circuit, with N≥2, with two differential signals to be compared being inputted to an input terminal of a first stage operational amplifier, an output terminal of a Nth stage operational amplifier being connected with an input terminal of the flip-latch, the biasing circuit supplying a biasing current to each stage operational amplifier, the control signal generating circuit being connected with the N-stage operational amplifier and the flip-latch respectively to supply a working time sequence and a reset control signal for them. Each stage operational amplifier has the same structure, which includes a first FET, a second FET, a third FET, a fourth FET, a fifth FET, a sixth FET, a seventh FET, and an eighth FET, with one of the differential signals being inputted to the gate of the first FET, the other differential signal being inputted to the gate of the second FET, the drain of the first FET being connected with the gate and the drain of the third FET respectively to output one of the differential signals that is amplified by the current stage operational amplifier, the drain of the second FET being connected with the gate and the drain of the sixth FET respectively to output the other differential signal that is amplified by the current stage operational amplifier, the sources of the first and the second FETs coupled jointly being connected with the biasing circuit, the sources of the third, the fourth, the fifth, and the sixth FETs being connected to an outer power source, the gates of the third and the fourth FETs being coupled together, the drain of the fourth FET being connected with the gate of the sixth FET, the gates of the fifth and the sixth FETs being coupled together, the source of the seventh FET, the gate and the drain of the eighth FET being connecting with the drain of the first FET respectively, and the source of the eighth FET, the gate and the drain of the seventh FET being connected with the drain of the second FET respectively.

Preferably, each stage operational amplifier includes a reset switch, and one end of the reset switch is connected with the drain of the first FET, the other end is connected with the drain of the second FET, and a control end of the reset switch is connected with the control signal generating circuit.

Preferably, the reset switch is closed if the control end thereof has high level voltage, and opened if the control end has low level voltage.

Preferably, the fourth FET and the fifth FET have the same width/length ratio.

Preferably, the seventh FET and the eighth FET have the same width/length ratio.

In comparison with the prior art, the amplifier circuit of the present invention includes the fourth and the fifth FETs to make the voltages of the two differential signals outputted by the current stage operational amplifier rise quickly or fall quickly, thus the amplifying speed of the differential signals (namely the comparison speed) is improved; and the seventh and the eighth FETs are connected in the form of diode, which clamps the differential signals outputted at the operational amplifier so as to limit the oscillation amplitude of the differential signals thereby further improving the comparison speed.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
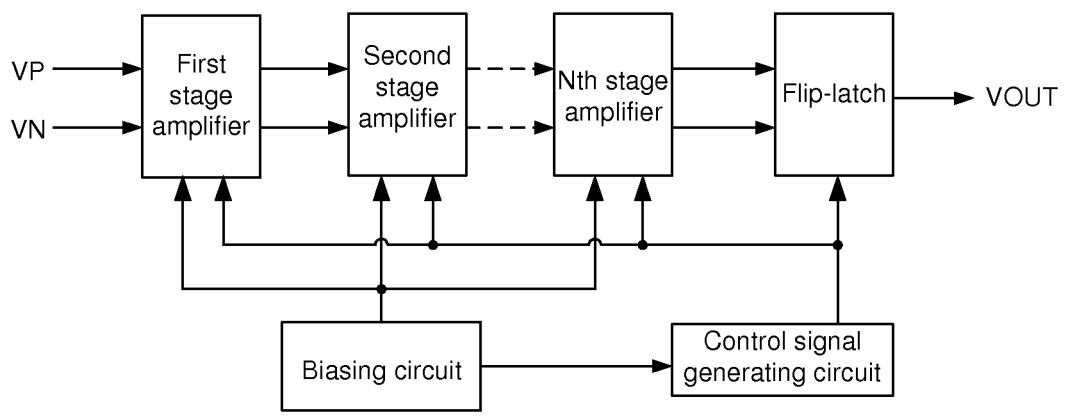
FIG. 1 is a schematic view of a quick comparison circuit according to one embodiment of the present invention.

Various preferred embodiments of the invention will now be described with reference to the figures, wherein like reference numerals designate similar parts throughout the various views. As indicated above, the invention is directed to a quick comparison circuit having high gain and quick comparison speed.

Referring to FIG. 1 that shows a schematic view of a quick comparison circuit according to one embodiment of the present invention, the circuit includes a cascaded N-stage (N≥2) operational amplifier, a flip-latch, a biasing circuit, and a control signal generating circuit. Two differential signals VP and VN to be compared are inputted to the input terminal of the first stage operational amplifier, the output terminal of the first stage operational amplifier is connected with the input terminal of the second stage operational amplifier, and the output terminal of the second stage operational amplifier is connected with the input terminal of the third stage operational amplifier, in turns, until the output terminal of the (N−1)th stage operational amplifier is connected with the input terminal of the Nth stage operational amplifier, therefore the differential signals are amplified by every stage operational amplifier in turn, so as to be identified by the flip-latch. In actual practice, the number of the stage (namely the value of N) can be configured according to the values of the differential signals and the recognizable value of the flip-latch. The output terminal of the Nth stage operational amplifier is connected with the input terminal of the flip-latch, so that the differential signals from the Nth stage operational amplifier can be compared quickly to output a comparison value VOUT. The biasing circuit is connected with each stage operational amplifier to provide a biasing current for them to ensure a normal operation. The control signal generating circuit is connected with the N-stage operational amplifier and the flip-latch respectively to supply a working time sequence and a reset control signal for them, so as to control the working and resetting of the N-stage operational amplifier and the flip-latch.

Figure 2:
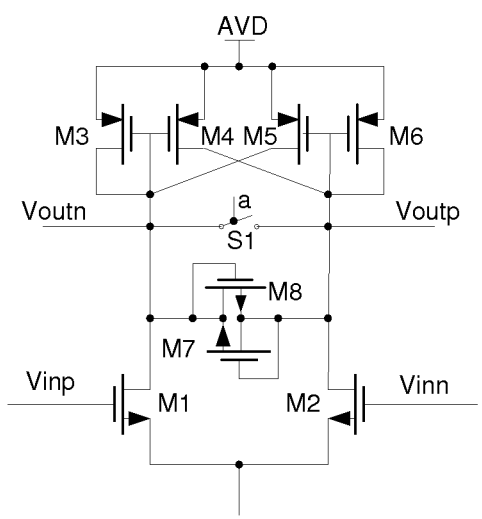
FIG. 2 is a circuit diagram of each stage operational amplifier shown in FIG. 1, with a control end connected with the switch S1.

Referring to FIG. 2, each stage operational amplifier has the same structure. Specifically, each one includes a first FET (field-effect transistor) M1, a second FET M2, a third FET M3, a fourth FET M4, a fifth FET M5, a sixth FET M6, a seventh FET M7, and an eighth FET M8. One differential signal Vinp (if the current amplifier is a first stage operational amplifier, this differential signal Vinp is an input differential signal VP; if this current amplifier is another stage operational amplifier, this differential signal Vinp is a signal that is outputted by the former stage one) is inputted to the gate of the first FET M1, the other differential signal Vinn (if the current amplifier is a first stage operational amplifier, this differential signal Vinn is an input differential signal VN; if this current amplifier is another stage operational amplifier, this differential signal Vinn is a signal that is outputted by the former stage one) is inputted to the gate of the second FET M2, that is, the differential signals Vinp and Vinn are inputted to the operational amplifiers via the first and the second FETs M1 and M2. The drain of the first FET M1 is connected with the gate and the drain of the third FET M3, and outputs a differential signal Voutn that is amplified by the current stage operational amplifier. Concretely, the sources of the first FET M1 and the second FET M2 are coupled together and then connected with the biasing circuit, so as to supply a biasing current to the current stage operational amplifier. The sources of the third, the fourth, the fifth and the sixth FETs M3, M4, M5, M6 are connected with the outer power source AVD, the gates of the third and the fourth FETs M3 and M4 are connected together, the drain of the fourth FET M4 is connected with the gate of the sixth FET M6, and the gates of the fifth and the sixth FETs M5, M6 are coupled together. Concretely, the source of the seventh FET M7, the gate and the drain of the eighth FET M8 are connected with the drain of the first FET M1 respectively, and the source of the eighth FET M8, the gate and the drain of the seventh FET M7 are connected with the drain of the second FET M2 respectively.

In a preferable embodiment, each stage operational amplifier may include a reset switch S1, and one end of the reset switch S1 is connected with the drain of the first FET M1, the other end is connected with the drain of the second FET M2, and its control end is connected with the control signal generating circuit, thereby the reset switch S1 is controlled by the voltage level outputted by the control signal generating circuit to close or open. Specifically, the reset switch S1 is closed if the control end thereof has high level voltage, and opened if the control end has low level voltage. Moreover, the current stage operational amplifier is reset when the reset switch S1 is in a closed state; and is on operation of amplifying the differential signals VP and VN in turn, when the reset switch S1 is in an open state.

Working principle of the quick comparison circuit of the present invention will be described by combining FIG. 1 and FIG. 2.

In the embodiment, it's necessary for the N-stage operational amplifier to amplify the differential signals VP and VN to the right value that can be identified by the flip-latch, thus a comparator may be configured by the operational amplifiers. As mentioned in the section of background of the invention, operational amplifiers in the comparator work in the open-loop mode, it's a need to consider their bandwidths and gains, but except for their linearity or stability, and so on. Specifically, the operational amplifiers in the quick comparison circuit according to the embodiments are unipolar operational amplifiers which are cascaded to form a comparator, and the total gain A of the comparator is that:

$$A = \prod_{i=1}^{N} A_i; \quad (1)$$

therein, N is a positive integer larger than 1, $A_i$ the denotes the gain of the i stage operational amplifier.

The settling time constant for setting up the comparator by the cascaded N-stage operational amplifier is that:

$$\tau = \sum_{i=1}^{N} \frac{A_i}{\omega_{ui}}; \quad (2)$$

therein, $\omega_{ui}$ denotes the unit gain bandwidth product (GBP).

If the total gain of formula (1) is wished to obtain by only one-stage operational amplifier, then the settling time is that:

$$\tau' = \frac{\prod_{i=1}^{N} A_i}{\omega_u}; \quad (3)$$

therein, $\omega_u$ denotes the GBP of the one-stage operational amplifier. It can be seen from formulas (2) and (3) that, $\tau' \gg \tau$, that is, the amplifying and comparison time is reduced remarkably by using a multi-stage and cascaded operational amplifier.

Conventionally, the settling time for cascading the N-stage operational amplifier has negative exponential response characteristic. However, since a flip-latch whose setting time has positive exponential response characteristic is connected behind the Nth stage operational amplifier in the present invention, thus the comparison speed is improved due to the positive exponential response characteristic of the flip-latch. In addition, if the difference between the differential input signals VP and VN is very small, this flip-latch may compensate the insufficient gain of the prepositive N-stage operational amplifier, to quickly amplify the signals to the recognizable amplitude for digital circuits.

Each stage operational amplifier in the N-stage operational amplifier of the present invention has the same structure, as shown in FIG. 2. Concretely, Vinp and Vinn denote the differential input signals to be compared, Voutn and Voutp denote the differential output signals. The first FET M1 and the second FET M2 are a differential pair, whose width/length (W/L) ratios are the same; the third FET M3 and the sixth FET M6 form a load with weak positive feedback structure, and the W/L ratio of the third FET M3 is the same with that of the sixth FET M6 which is $S_{3,6}$, the W/L ratio of the fourth FET M4 is the same with that of the fifth FET M5 which is $S_{4,5}$ and $S_{3,6} > S_{4,5}$. The reset switch S1 is closed while in high level, which causes the current stage operational amplifier reset; and opened while in low level, which causes the current stage operational amplifier amplify the differential signals. The seventh FET M7 and the eighth FET M8 are connected in the form of a diode, which clamps the voltage difference between the differential output signals Voutp and Voutn below the breakover voltage of diode, that is, |Voutp−Voutn|≤$V_{th}$ ($V_{th}$ is the breakover voltage of diode), therefore the output oscillation amplitude is limited to accelerate the comparison operation. Furthermore, the W/L ratios of the seventh and the eighth FET M7, M8 are the same, thus the breakover voltages and the clamp voltages are the same accordingly. Specifically, if the differential input signals Vinp>Vinn, then the current flowing through the first FET M1 will be increased, the current through the second FET M2 will be decreased, the gate voltages of the third and the fourth FET M3, M4 will be decreased accordingly, and the gate voltages of the fifth and the sixth FET M5, M6 will be increased, so that the voltage of the signal Voutn will be decreased gradually, while that of the signal Voutp will be increased gradually. As a result, the current through the fourth FET M4 will be increased due to the decreased gate voltage thereof, while the current through the fifth FET M5 will be decrease due to the increased gate voltage. In such a way, the voltage decreasing of the signal Voutn and the voltage increasing of the signal Voutp are accelerated, namely the amplifying operation for the differential signals is accelerated. And the gain of the operational amplifier is that:

$$Av1 = \frac{g_{m1,2}}{g_{m3,6} - g_{m4,5}}; \quad (4)$$

therein, $g_m$ denotes transconductance of FET. It can be seen that, the structure of weak positive feedback load can improve the gain of the operational amplifier, and improve the comparison speed meanwhile.

In addition, the comparison speed is furthered improved due to the reset switch S1, and the clamp diodes composed of the seventh FET M7 and the eighth FET M8. Concretely, the reset switch S1 will reset the operational amplifier before the amplifying operation is carried out, so as to clear the status before amplifying thereby improving the amplifying speed for the next time. Further, the voltage difference between the differential output signals is controlled by the clamp diodes set on the differential output terminal. If the difference between the differential output signals after the last time is great, which causes the signals to be flipped; such remarkable signal flip will decrease the flip speed of signal due to oscillation frequency, and decrease the amplifying speed accordingly. That's why the clamp diodes are added. Due to the clamp diodes, the oscillation amplitude of the differential output signals is restricted. When the differential output signals |Voutp−Voutn|<$V_{th}$ (therein $V_{th}$ is the threshold voltage of the seventh FET M7 or the eighth FET M8, and also is the breakover voltage of diode), the diode will not be turned on to amplify; when the differential output signals |Voutp−Voutn|>$V_{th}$, the diode will be turned to clamp the differential output signals to cause |Voutp−Voutn|=$V_{th}$, in such a way, the oscillation amplitude of differential output signals can be restricted to improve comparison speed, by configuring a suitable value for $V_{th}$.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A quick comparison circuit, comprising a cascaded N-stage operational amplifier, a flip-latch, a biasing circuit, and a control signal generating circuit, with N≥2, and two differential signals to be compared being inputted to an input terminal of a first stage operational amplifier, an output terminal of a Nth stage operational amplifier being connected with an input terminal of the flip-latch, the biasing circuit supplying a biasing current to each stage operational amplifier, the control signal generating circuit being connected with the N-stage operational amplifier and the flip-latch respectively to supply a working time sequence and a reset control signal for them;

each stage operational amplifier having the same structure, which comprises a first FET, a second FET, a third FET, a fourth FET, a fifth FET, a sixth FET, a seventh FET, and an eighth FET, with one of the differential signals being inputted to the gate of the first FET, the other differential signal being inputted to the gate of the second FET; the drain of the first FET being connected with the gate and the drain of the third FET respectively to output one of the differential signals that is amplified by the current stage operational amplifier, the drain of the second FET being connected with the gate and the drain of the sixth FET respectively to output the other differential signal that is amplified by the current stage operational amplifier; the sources of the first and the second FETs coupled jointly being connected with the biasing circuit, the sources of the third, the fourth, the fifth, and the sixth FETs being connected to an outer power source, the gates of the third and the fourth FETs being coupled together, the drain of the fourth FET being connected with the gate of the sixth FET, the gates of the fifth and the sixth FETs being coupled together, the source of the seventh FET, the gate and the drain of the eighth FET being connecting with the drain of the first FET respectively, and the source of the eighth FET, the gate and the drain of the seventh FET being connected with the drain of the second FET respectively.

2. The quick comparison circuit according to claim 1, wherein each stage operational amplifier comprises a reset switch, and one end of the reset switch is connected with the drain of the first FET, the other end is connected with the drain of the second FET, and a control end of the reset switch is connected with the control signal generating circuit.

3. The quick comparison circuit according to claim 2, wherein the reset switch is closed if the control end thereof has high level voltage, and opened if the control end has low level voltage.

4. The quick comparison circuit according to claim 2, wherein the fourth FET and the fifth FET have the same width/length ratio.

5. The quick comparison circuit according to claim 2, wherein the seventh FET and the eighth FET have the same width/length ratio.

* * * * *